United States Patent [19]
Smith

[11] Patent Number: 6,078,601
[45] Date of Patent: Jun. 20, 2000

[54] METHOD FOR CONTROLLING THE OPERATION OF A LASER

[76] Inventor: David F. Smith, 7222 Whispering Pines Dr., Dallas, Tex. 75248

[21] Appl. No.: 08/813,751

[22] Filed: Mar. 7, 1997

[51] Int. Cl.[7] ............................................ H01S 3/00
[52] U.S. Cl. .................................................. 372/38
[58] Field of Search ................... 372/25, 31, 38

[56] References Cited

U.S. PATENT DOCUMENTS 5,033,061  7/1991  Hobart et al. .............................. 372/38

*Primary Examiner*—Rodney B. Bovernick
*Assistant Examiner*—Robert E. Wise
*Attorney, Agent, or Firm*—William D. Lanyi; John G. Shudy; Roland W. Norris

[57] ABSTRACT

A control method is provided by which a laser output can be controlled through the use of a signal provided by a photodiode that receives a reflected ratio of the laser output signal. A time varying signal is added to the low magnitude portions of an electrical data input signal to the laser. This first electrical monitoring signal, which is essentially an average output from the photodiode because of its frequency response, is then passed through a low pass filter to provide a second electrical monitoring signal. The first electrical monitoring signal is multiplied by a time varying signal to provide a third electrical monitoring signal. The time varying signal, which can be a sinusoidal waveform, is added to the low magnitude portions of an electrical input signal provided to the laser. The third electrical monitoring signal is averaged over time by a low pass filter to provide a fourth electrical monitoring signal. Therefore, by adding the time varying signal, or tone, to the electrical input signal of the laser, the output power of the laser can be controlled so that the laser is operated at an appropriate threshold magnitude and with an appropriate depth of modulation, regardless of possible temperature effects on the operating characteristics of the laser.

20 Claims, 17 Drawing Sheets

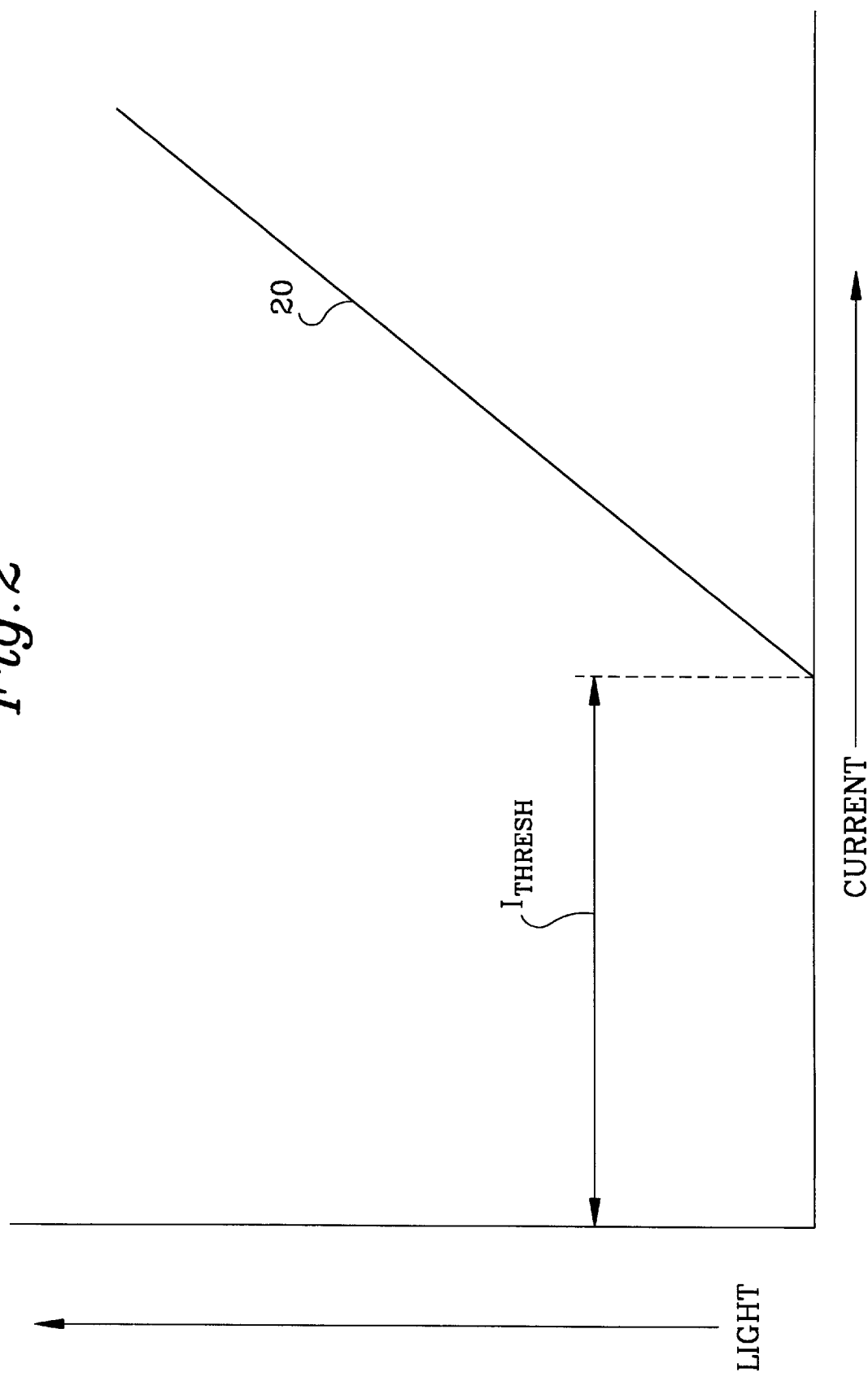

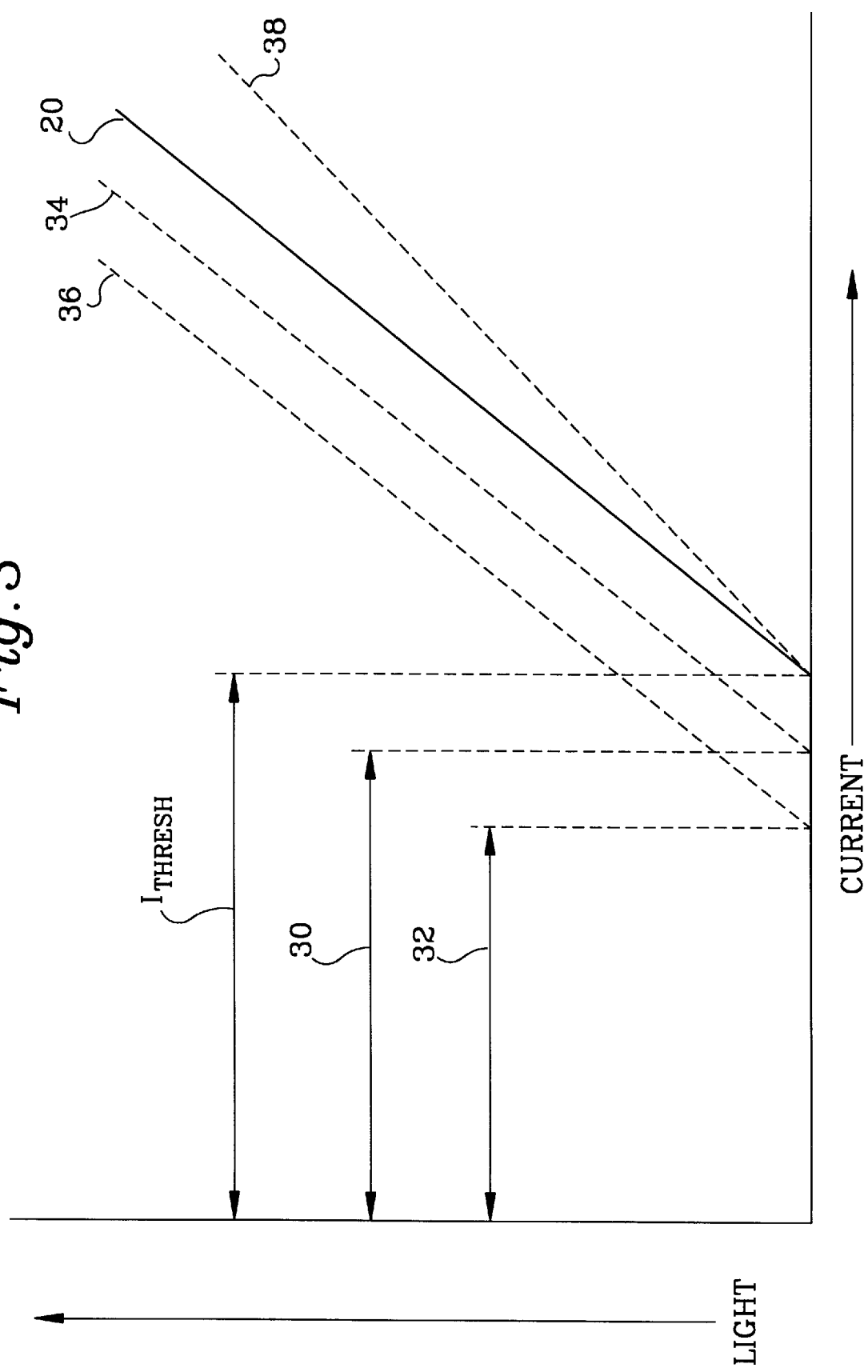

METHOD FOR CONTROLLING THE OPERATION OF A LASER

BACKGROUND OF THE INVENTION

1. Field of the Invention

The present invention generally relates to a method for controlling a laser and, more specifically, to a method for controlling the output of a vertical cavity surface emitting laser (VCSEL) by adding a time varying signal to a preselected portion of a digital data signal in order to be able to control the operation of the laser by monitoring the average power of a portion of the light output from the laser.

2. Description of the Prior Art

In certain applications of lasers, it is necessary to monitor the power of the light output from the laser. In edge emitting lasers, this function is performed by providing a photodiode to receive a portion of the light output from the edge emitting laser. Typically, the monitor photodiode is placed at a location opposite to that in which the operational light output of the laser is directed. If the laser is a vertical cavity surface emitting laser (VCSEL), this monitoring function is more difficult. Since light is emitted from a surface of the laser structure and not its edges, a portion of the light must be reflected back toward a light sensitive component such as a photodiode. The reflection of a preselected ratio of the light output from the laser can be accomplished by using a lens that is partially mirrored so that a portion of the light output from the laser is reflected back from the lens and falls upon a photodiode.

As will be described in greater detail below, high speed digital signals present a particular problem in terms of monitoring the output of a VCSEL. In a high speed digital signal, the rise and fall of the magnitude of electrical current passing through the VCSEL occur at such a rapid rate that the monitoring photodiode is unable to provide a monitoring signal that is sufficiently responsive to yield information regarding the depth of the signal (i.e. the difference in magnitude between the on pulses and the off pulses) or the bias level of the signal. This inability to track the rapid pulses with a photodiode is further complicated by the complicated manner in, which the bias level and depth magnitude of the signal can interact with each other to change their individual magnitudes without actually changing the average power level of the signal which is the only variable that can be directly monitored by the photodiode.

It would therefore be significantly beneficial if a method of controlling a VCSEL could be developed in which the average power monitoring signal provided by a photodiode could be sufficient to permit the control system to determine when either the bias level or depth magnitude of the digital signal is improper and requires correction. In addition, it would be significantly beneficial if this controlling method could allow both the bias level and depth magnitude of the signal to be corrected during operation without adversely affecting the accurate correspondence between the light output pulses from the laser and the electrical input pulses received by the laser.

SUMMARY OF THE INVENTION

The present invention provides a method for controlling the a vertical cavity surface emitting laser (VCSEL) that allows both the bias level and depth magnitude of a light output signal from the laser to be individually controlled by monitoring only the average power level of a reflected portion of the light output signal.

A preferred embodiment of the present invention provides a method for controlling the operation of a type of laser which provides a digital output signal in response to receiving a digital electrical input signal which consists of low magnitude portions and high magnitude portions. The method comprises the step of adding a time varying signal to the low magnitude portions of the digital electrical input signal. The time varying signal, or tone signal, has a frequency that is much lower than the frequency of the digital electrical input signal and it has an amplitude that is much less than the amplitude of the digital electrical input signal.

The method of the present invention further comprises the step of causing a representative ratio of the digital light output signal to be received by a light sensitive component. This can be done in several ways. One possible method for causing the ratio to be received is to provide a partially reflective lens for the VCSEL in which a preselected ratio of output light is reflected back toward the light sensitive component so that its bias level and depth magnitude can be monitored. In a typical application of the present invention, the light sensitive component is a photodiode. The photodiode can be placed at one side of the VCSEL within the VCSEL housing structure. Alternatively, the VCSEL can be placed in a central portion of a photodiode and be surrounded by the photodiode material. Either way is acceptable for use in conjunction with the method of the present invention.

The present invention further comprises the step of providing a first electrical monitoring signal from the light sensitive component, or photodiode, which is representative of an average value of the digital light output signal over time. The provision of this first electrical monitoring signal can occur normally if the light sensitive component, such as the photodiode, has a frequency response which is significantly less than the frequency of the digital light output signal. If a photodiode is used as the light sensitive component and the digital light output signal has a frequency in excess of approximately ten times the low frequency bandwidth, the first electrical monitoring signal provided by the photodiode will be equivalent to an average value of the power received by the photodiode. The light sensitive component has a frequency response such that the frequency of the time varying signal portion of the representative ratio of the digital light output signal passes and is represented by the first electrical monitoring signal while the higher frequency changes of the representative ratio between the high magnitude portions of the digital light output signal and low magnitude portions do not pass and are not represented by the monitoring signal other than in their combined effect on the average power received by the light sensitive component.

The present invention further comprises the step of averaging the first electrical monitoring signal over time to provide a second electrical monitoring signal. It should clearly be understood that the second electrical monitoring signal is, in effect, an average of an average signal since the first electrical monitoring signal provided by the light sensitive component is, in actuality, an average power signal of the light received by the light sensitive component.

The present invention further comprises the step of multiplying the first electrical monitoring signal by the time varying signal in order to provide a third electrical monitoring signal. This third electrical monitoring signal is the result of multiplying the average power signal received from the light sensitive component by the original time varying signal, or tone signal, that was used in the adding step of the present invention to be added to the low portions of the digital electrical input signal.

The present invention further comprises the step of averaging the third electrical monitoring signal over time to provide a fourth electrical monitoring signal.

The present invention also comprises a step of controlling the magnitude of the low magnitude portions of the digital electrical input signal and the differential magnitude between the low magnitude portions and the high magnitude portions of the digital electrical input signal as a function of the second electrical monitoring signal and the fourth electrical monitoring signal.

In a preferred embodiment of the present invention, the time varying signal is sinusoidal and the laser is a vertical cavity surface emitting laser, or VCSEL. In certain embodiments of the present invention, the adding step limits the addition of the time varying signal to a preselected section of each of the low magnitude portion of the digital electrical input signal. In other words, although certain embodiments of the present invention can add the sinusoidal tone signal to the entire duration of each of the individual low magnitude portions, this is not required in all embodiments. Alternatively, the tone signal can be added to preselected segments of the individual low magnitude portions. These preselected segments can be central to the magnitude low portions. For example, in certain embodiments of the present invention,, these preselected sections are separated by time by a predetermined period from the immediately preceding high magnitude portion of the digital electrical input signal and the immediately succeeding high magnitude portion of the digital electrical input signal. In other words, the tone signal can be added to a centralized region, or centralized preselected section, of the low portion of the digital electrical input signal between the most recent falling edge of a high portion and the next rising edge of a high portion.

In certain embodiments of the present invention, the adding step can further comprise adding a preselected signal to the high magnitude portions of the digital electrical input signal, wherein the signal that is added to the high magnitude portions is 180 degrees out of phase from the time varying signal added to the low magnitude portions. An alternative to this adding step could comprise adding a signal to the high magnitude portions which is 90 degrees out of phase with the time varying signal instead of 180 degrees out of phase. Stated more generally, the adding step could possibly comprise adding a preselected signal to the high magnitude portions of the digital electrical input signal, wherein the added signal is out of phase with the time varying signal by a preselected magnitude of degrees. That preselected magnitude of degrees can be any magnitude. In certain embodiments of the present invention, this magnitude can be 90 degrees or 180 degrees, but the scope of the present is not limited by these exemplary values.

In certain embodiments of the present invention, the causing step comprises a step of providing a partially reflective lens, through which the digital light output signal passes and from which the representative ratio of the digital light output signal is reflected. This light is reflected back toward the light: sensitive component, or photodiode, so that the photodiode can provide the first electrical monitoring signal.

BRIEF DESCRIPTION OF THE DRAWINGS

The present invention will be more fully and completely understood from a reading of the Description of the Preferred Embodiment in conjunction with the drawings, in which:

FIG. 2 is a graphical representation of the operating characteristic of a typical VCSEL;

FIG. 3 shows how the operating characteristic of a VCSEL can change in response to changes in temperature;

DESCRIPTION OF THE PREFERRED EMBODIMENT

Figure 1A:
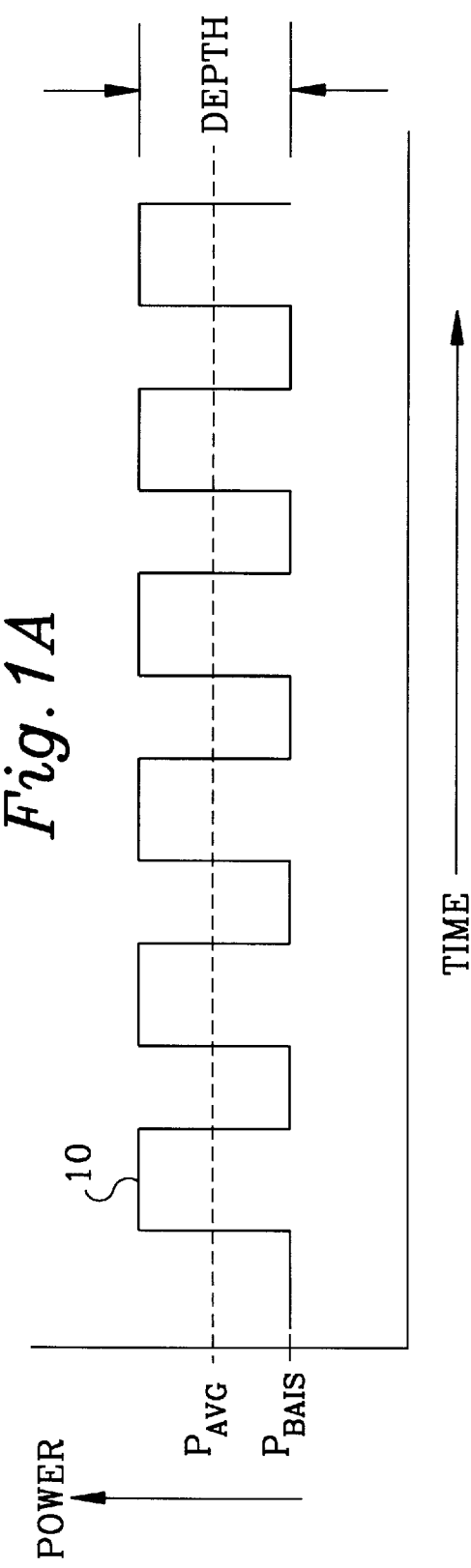
FIGS. 1A and 1B illustrate that two signals of significantly different characteristics can yield the same average power reading.

Throughout the Description of the Preferred Embodiment, like components will be identified by like reference numerals.

Figure 1B:
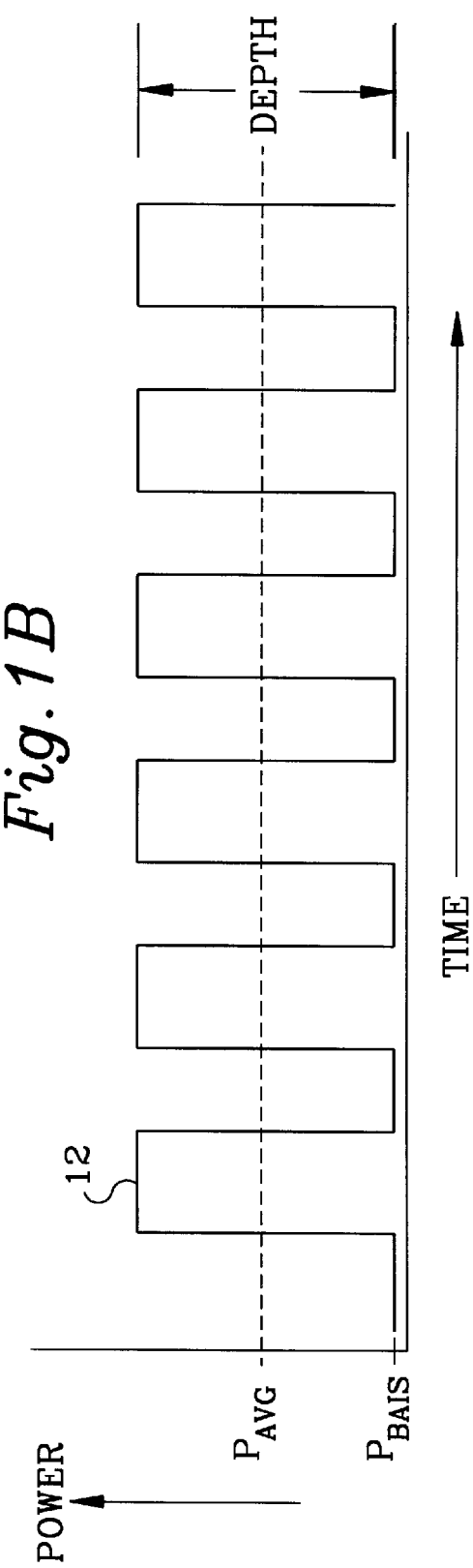

FIGS. 1A and 1B illustrate a basic problem that must be solved with regard to the control of a laser output. FIGS. 1A and 1B show two pulse streams, 10 and 12, that vary significantly in two different characteristics. Pulse stream A is shown having a bias power level $P_{BIAS}$ and a certain magnitude of depth between the power of the low magnitude portions and high magnitude portions of the signal. Also shown in FIG. 1A is the average power $P_{AVG}$ over time of signal 10. Signal 12, shown in FIG. 1B, also has a bias level $P_{BIAS}$ and a magnitude of depth between its low magnitude portions and high magnitude portions. In addition, the average power $P_{AVG}$ is shown in FIG. 1B for signal 12.

By comparing FIGS. 1A and 1B, it can be seen that two signals, 10 and 12, of significantly different bias power levels $P_{BIAS}$ and magnitudes of depth can result in the same average power $P_{AVG}$. FIGS. 1A and 1B illustrate that, according to techniques known by those skilled in the art, controlling the bias level and magnitude of depth of a digital signal, when only the average power $P_{AVG}$ is available for this purpose, is not possible. Unfortunately, in many types of VCSEL structure, only a photodiode is available for the purpose of monitoring the output of the laser. Since a photodiode does not have a sufficiently high frequency response to provide an electrical signal corresponding to the type of light output signals represented in FIGS. 1A and 1B, the photodiode can only provide an electrical monitoring signal representing the average power $P_{AVG}$ of the light output signal, 10 or 12, over time. The present invention addresses this problem and provides a method by which the monitoring signal from the photodiode can be used to control both the bias level $P_{BIAS}$ and the magnitude of the depth between the low magnitude portions and high magnitude portions of the signal as a function of the average power level $P_{AVG}$.

FIG. 2 shows an exemplary characteristic of the light output from a VCSEL in response to a current flowing through the VCSEL. As shown in FIG. 2, a certain threshold current $I_{THRESH}$ is required before light is emitted from the VCSEL. Then, increased current above the threshold current causes increased light to be emitted. This relationship is represented by line 20. In order to create a stream of light pulses from the VCSEL, the threshold current must be changed from a magnitude less than the threshold current to a current greater than the threshold current in order to create the low magnitude portions and high magnitude portions of the light output signal.

FIG. 3 shows how changing characteristics of a VCSEL can result in an improper light output magnitudes. VCSELs are sensitive to temperature variations changes in temperature can change the operating characteristics of a VCSEL in various ways. For example, the threshold current $I_{THRESH}$ described above in conjunction with FIG. 2 can change as a function of temperature change. In addition, the slope of line 20 in FIG. 2 can change as a result of a temperature change. Also in FIG. 3, line 20 represents the situation shown in FIG. 2. In FIG. 3, the threshold current $I_{THRESH}$, described above in conjunction with FIG. 2, is illustrated along with two decreased threshold currents, 30 and 32. This decrease in threshold current magnitude can result from a change in temperature. It should be understood that a temperature change can affect the threshold current by increasing it or decreasing it. Lines 34 and 36 correspond to the changes in threshold currents identified by reference numerals 30 and 32, respectively. As can be seen, the lines, 34 and 36, are shifted from the position of line 20 as a result of the change in threshold current.

With continued reference to FIG. 3, line 38 illustrates a, change in slope of line 20 even if the threshold current remains the same. Temperature variations can cause a VCSEL to experience a change in operating characteristics in which the slope of line 20 changes. FIG. 3 illustrates various types of effects on the operating characteristic of a VCSEL which can result from temperature change.

Figure 4A:
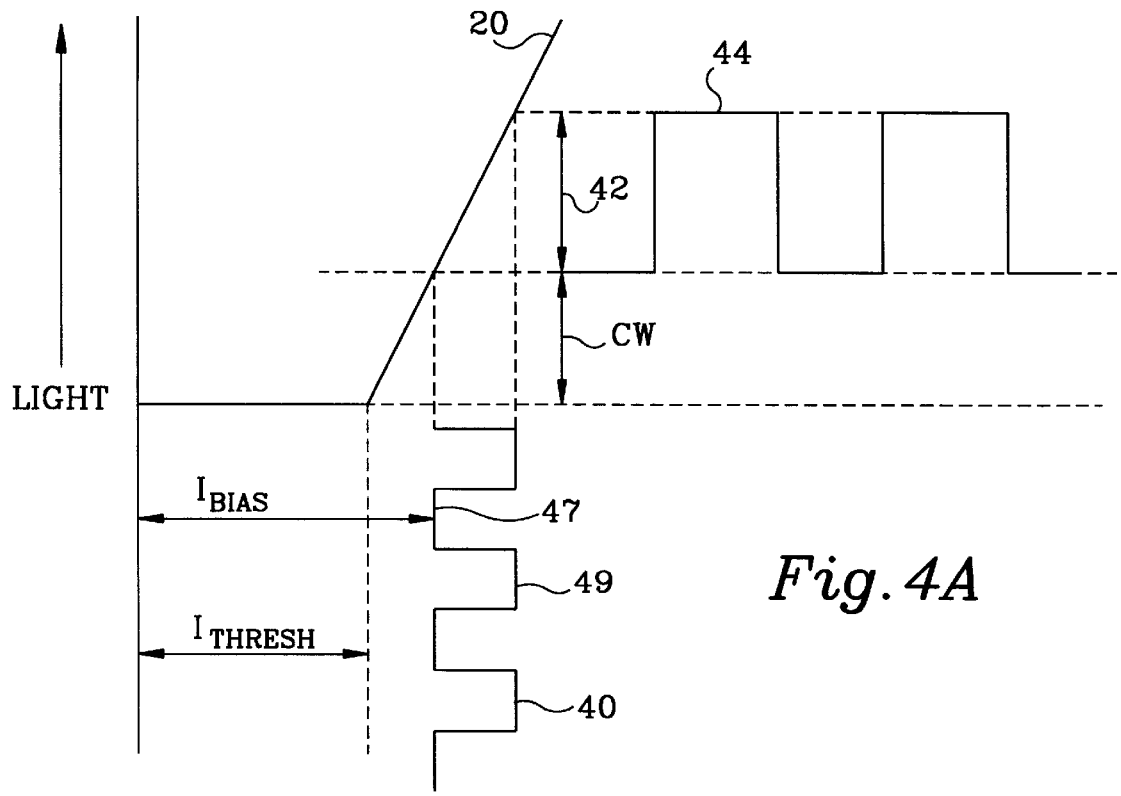
FIGS. 4A and 4B show two potential deleterious results, that can occur if the threshold and bias current of a laser are not properly controlled and regulated.

FIG. 4A shows one operating characteristic of a VCSEL. The bias level $I_{BIAS}$ of a current signal 40 is greater than the threshold level $I_{THRESH}$ of the VCSEL. As a result, the minimal current passing through the VCSEL is always sufficient to cause the VCSEL to emit light at a magnitude identified as the continuous wave CW in FIG. 4A. The modulated light 42 is the magnitude of the depth of the signal as described above in conjunction with FIGS. 1A and 1B. FIG. 4A is intended to show how a current signal 40 is converted into a light signal 44 as a function of the operating characteristic 20 of a VCSEL. The situation represented in FIG. 4A is disadvantageous in certain applications because light is always emitted from the laser even when the current signal 40 is at its lowest magnitude. Under ideal conditions, the low magnitude portion 47 of a current signal 40 should cause no light to be emitted from the VCSEL. Light should only be emitted in response to the high magnitudes portions 49 of the electrical signal.

Figure 4B:
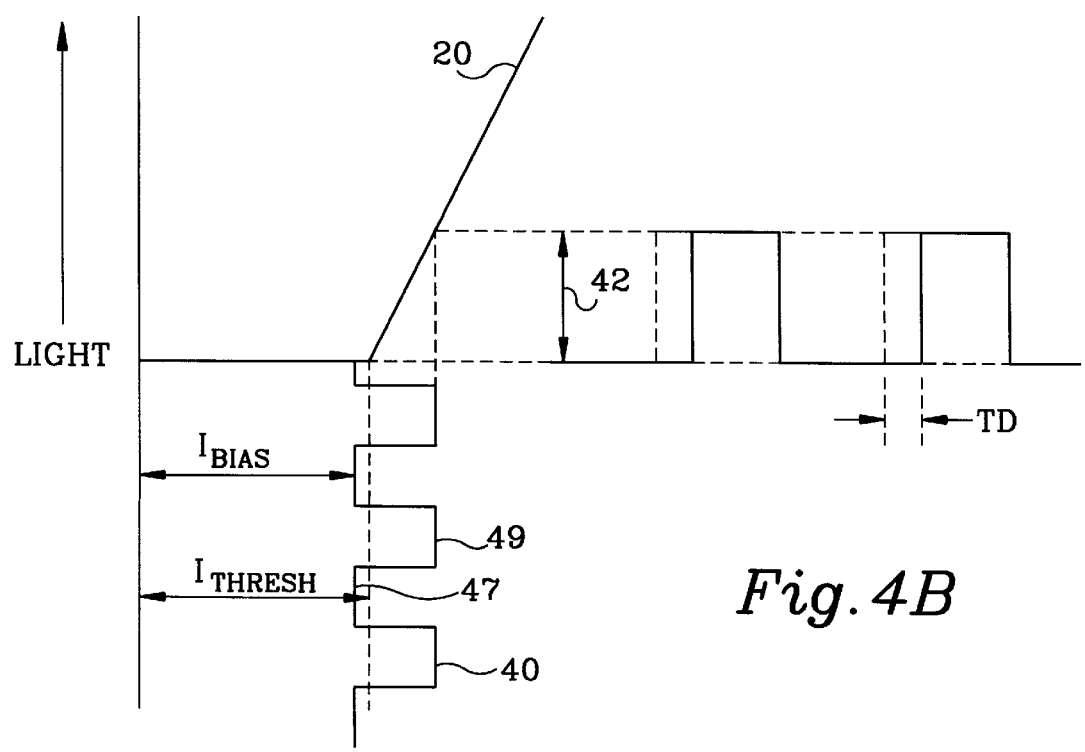

FIG. 4B illustrates a condition opposite to that shown in FIG. 4A. The bias current $I_{BIAS}$ of signal 40 is less than the threshold signal by a measurable amount. As a result, when signal 40 changes from its low magnitude portion 47 to its high magnitude portion 49, some finite period of time passes while the current rises from the bias level $I_{BIAS}$ to the threshold level $I_{THRESH}$. During this finite period of time, no light is emitted from the VCSEL. As a result, a time delay TD passes between the instant when the electrical signal begins to change from a low magnitude portion 47 to a high magnitude portion 49 and the time when the actual light emission begins.

The conditions shown in FIGS. 4A and 4B are both disadvantageous for different reasons. The situation shown in FIG. 4A causes a constant emission of light from the laser. The light changes from low intensity to high intensity, but the continuous wave CW is always emitted. Preferably, signal 40 should result in periodic emissions of light separated by periods of no light emission. The condition represented in FIG. 4B results when the bias current $I_{BIAS}$ of signal 40 is less than the threshold current. As described above in conjunction with FIG. 3, the threshold current $I_{THRESH}$ of the laser can change as an result of a change in temperature.

The conditions shown in FIGS. 4A and 4B represent circumstances that require correction. The correction can be accomplished by modifying the bias current $I_{BIAS}$ so that it approximately equals the threshold current of the laser. As the threshold current changes because of a temperature change, the control circuit should be able to increase or decrease the bias current to conform to those changes and to provide a clean signal that emits light when the current signal 40 is high, but does not emit light when it is low. However, as will be described in greater detail below, most VCSELs are provided with a monitoring feature that is not able to respond with sufficient speed to detect the different magnitudes of the light output from the laser as it changes from the low magnitude portion to the high magnitude portion. Instead, most lasers are limited to using a photodiode to receive a preselected ratio of the output light, as a reflected signal, and measure the average power $P_{AVG}$ of that reflected light.

Figure 5:
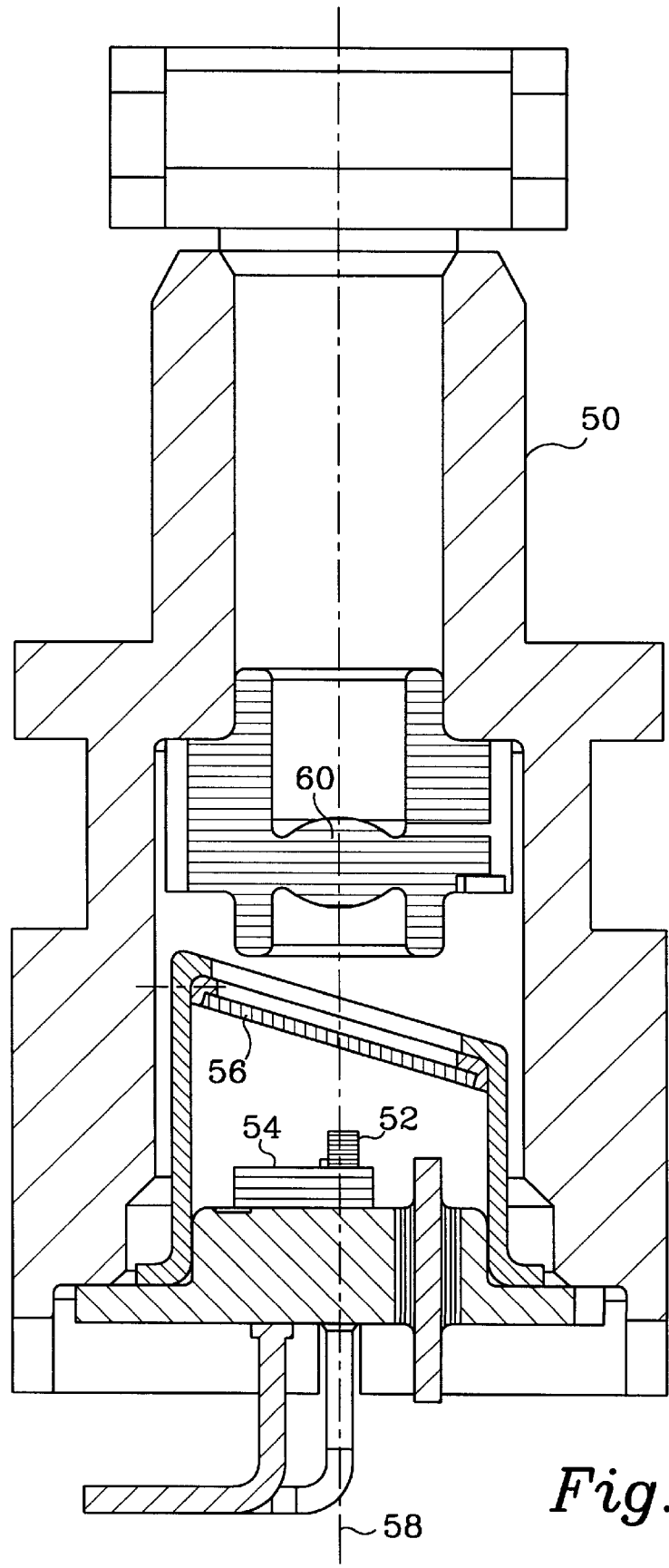
FIG. 5 is a cross sectional representation of an exemplary VCSEL.

FIG. 5 illustrates an exemplary laser structure that can be used in a preferred embodiment of the present invention. Within a housing 50, a VCSEL 52 is associated with a photodiode 54 and with a partially reflective lens 56 that is mounted at an angle to a centerline 58 passing through the center of the housing structure and aligned with a beam of light emitted by the VCSEL 52. Light passes from the VCSEL 52 through the slanted lens 56 and another lens 60. the light then continues to pass upward in FIG. 5 and out of the housing 50. In certain applications of VCSELs, an optical fiber can be attached to the end of the housing 50 and be aligned with centerline 58 to receive light emitted by the VCSEL 52 for the purpose of communicating a digital signal. In order to monitor the output light signal from the VCSEL 52, a portion of the output light signal is reflected back by the slanted lens 56 toward the photodiode 54. This photodiode serves as a light sensitive component that receives the reflected signal. It should be understood that the slanted lens 56 is partially reflective and is provided so that a ratio of the output light signal can be reflected back toward the photodiode 54 for the purposes of monitoring the output signal from the laser. As described above, the frequency response of the photodiode is not sufficiently high to respond to each change in magnitude of the digital light output signal. For example, the frequency of the digital output light signal can be approximately one gigahertz while the frequency response of a typical photodiode 54 is much less. As Ad result, the electrical monitoring signal provided by the photodiode 54 is, in effect, a signal that represents the averages power $P_{AVG}$ over time of the reflected signal.

The challenge presented by a device such as that shown in FIG. 5 is to develop a method for controlling the output power of the VCSEL 52 by receiving only the average power signal $P_{AVG}$ from the photodiode 54. In view of the discussion relating to FIGS. 1A and 1B and the later discussion with respect to FIGS. 4A and 4B, it can be realized that receipt of only an average power signal $P_{AVG}$ is generally insufficient to allow at control circuit to monitor and control both the bias current $I_{BIAS}$ and the modulation depth 42 described above in conjunction with FIGS. 4A and 4B. The present invention provides that capability so that a control circuit can monitor and control the operation of the VCSEL by measuring the average power signal provided by the photodiode 54 in response to its receipt of at reflected ratio of the output signal from the VCSEL 52.

Figure 6:
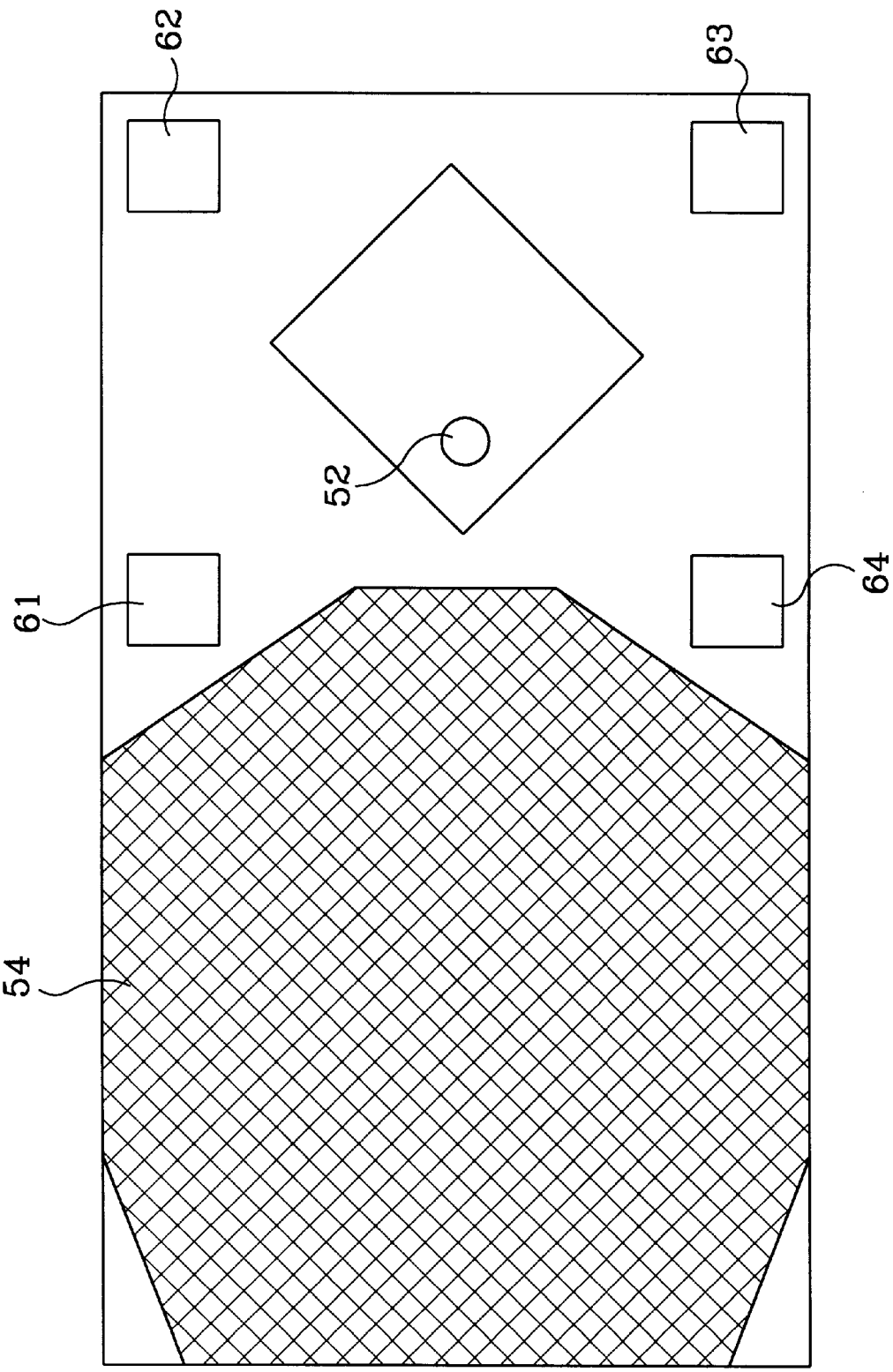
FIG. 6 is a top view of a photodiode and VCSEL illustrated in FIG. 5.

FIG. 6 is a top view of the VCSEL structure 52 and photodiode structure 54 described above in conjunction with FIG. 5. The photodiode 54 is a region of the combined structure that receives light reflected from the slanted lens 56. The VCSEL 52 emits light along centerline 58 described above in conjunction with FIG. 5. Four contact pads, 61–64, are provided to facilitate electrical communication between them components shown in FIG. 6 and external devices.

Figure 7:
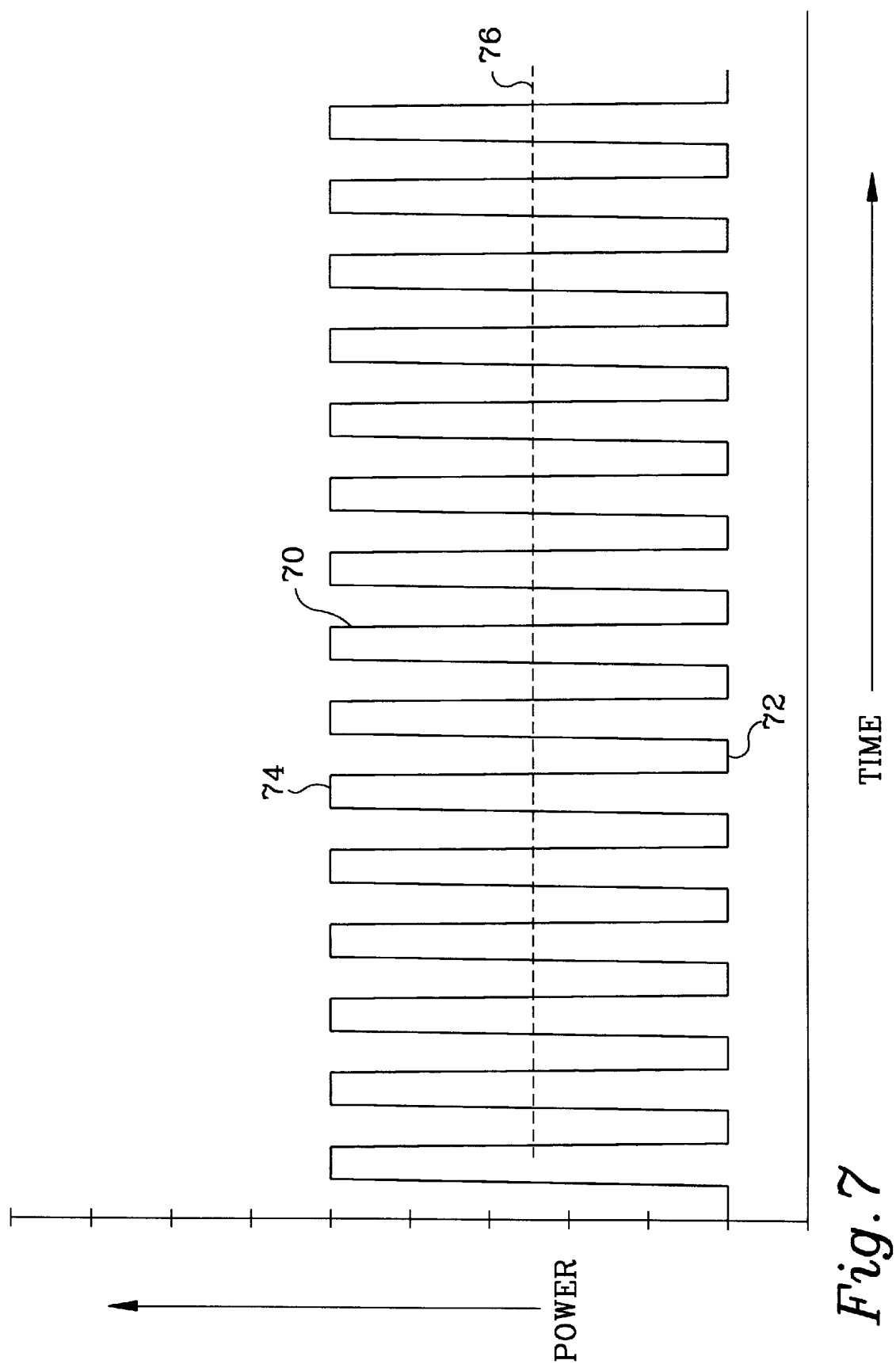
FIG. 7 is a graphical representation of a data output signal from a VCSEL and the average power of that signal measured over time.

For purposes of describing the steps of the present invention, FIG. 7 shows a digital light output signal 70 such as that which would typically be output by a laser in response to the receipt of a digital electrical input signal. FIG. 7 is generally similar to FIGS. 1A and 1B, but is reproduced for the specific purpose of allowing later Figures to illustrate changes in various signals as a result of the manipulative steps of the present invention. The digital light output signal 70 comprises low magnitude portions 72 and high magnitude portions 74 which, combined together, represent the high and low signals of at communication message such as that which is transmitted on optical fibers for use in various data communication systems, such as local area networks. The average power magnitude of the digital light output signal 70 is represented by the dashed line 76 which is the average power $P_{AVG}$ of the digital signal 70, taken over time. If signal 70 is directed toward a photodiode, the frequency response of the photodiode would typically provide an electrical signal generally equivalent to dashed line 76 which is the average power of the light signal.

Figure 8:
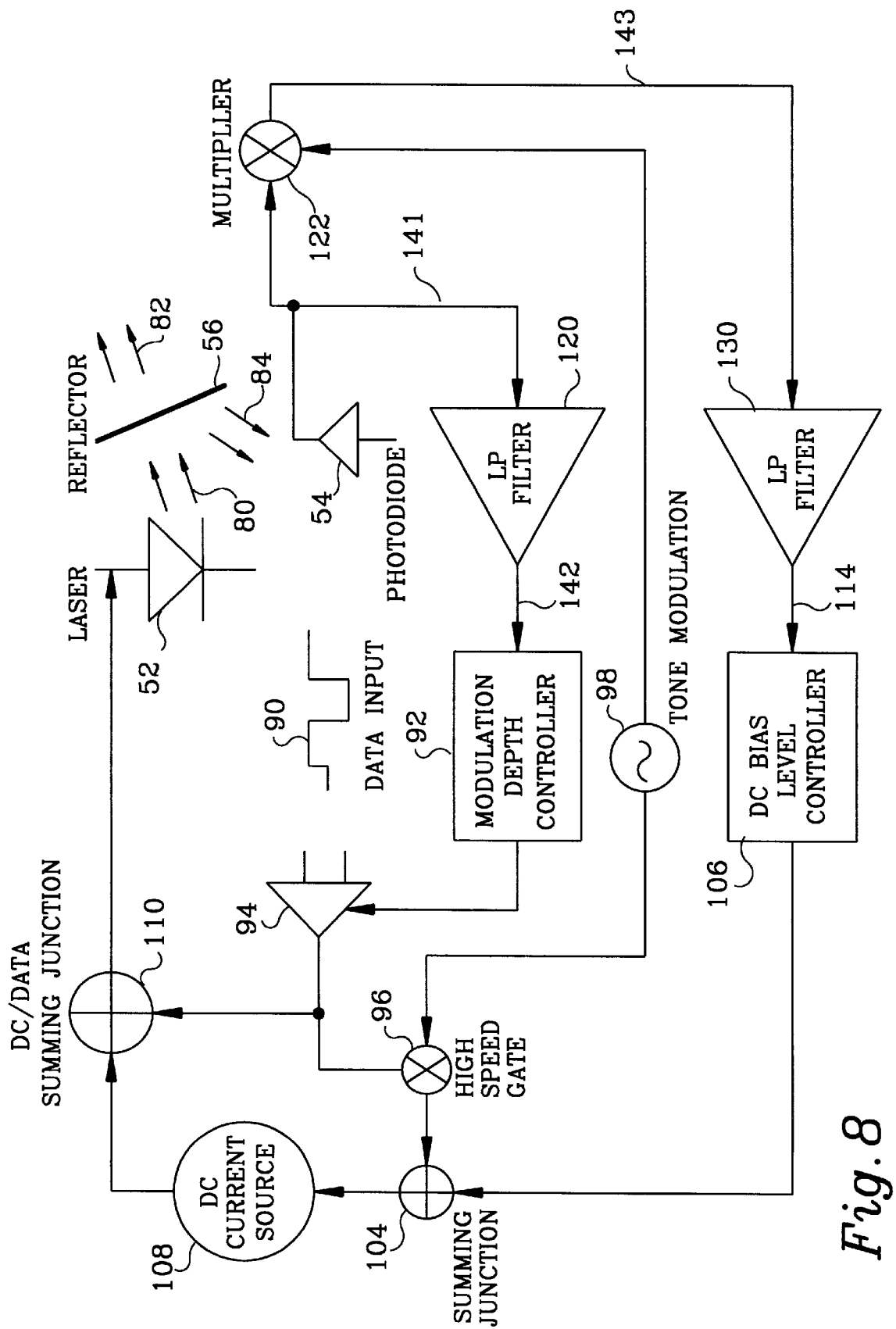
FIG. 8 is a highly schematic representation of the operation of the present invention.

FIG. 8 is a highly schematic illustration of the basic operation of the present invention. The VCSEL 52 emits light 80 in the direction of the slanted lens 56. A portion of the light passes through the slanted lens and is emitted from the laser housing as described in conjunction with FIG. 5. This emitted light is identified by reference numeral 82 in FIG. 8. A preselected portion of the emitted light 80 is reflected by the slanted lens 56 in the direction of the photodiode 54. This reflected light 84, which represents a fixed ratio of the total emitted light 80, is received by the photodiode 54 and, in response, the photodiode 54 provides a first electrical monitoring signal which is used by the present invention. The production of the monitoring signals will be described in greater detail below. FIG. 8 is intended to show the methods by which the various electrical monitoring signals are produced.

With continued reference to FIG. 8, reference numeral 90 identifies a digital electrical input signal which is received by the VCSEL as an input. This digital current signal passes through the structure of the VCSEL 52, in normal applications, and results in a varying light emission 80 from the VCSEL. The digital electrical input signal 90 in FIG. 8 is generally similar to the signal identified by reference numeral 40 in FIGS. 4A and 4B. The magnitude of modulation depth is controlled by a modulation depth controller 92 which affects the amplification of signal 90 by amplifier 94. The modulation depth controller 92 will be described in greater detail below. The output signal from amplifier 94 is used to control a high speed gate 96. A tone modulation source 98 provides a time varying signal, such as a sinusoidal signal, to the high speed gate 96. The high speed gate 96, which is controlled by the output of amplifier 94, provides a signal to a summing junction 104. The summing junction adds the output from a DC bias level controller 106 to the output from the high speed gate 96. This output from the summing junction 104 is provided to a DC current source 108 and is added, by a DC/data summing junction 110 to the output of amplifier 94. As a result, the time varying signal provided by the tone modulation source 98 can be added to the low magnitude portions of the amplified digital electrical input signal 90.

With continued reference to FIG. 8, the output from the photodiode 54 is provided to a low pass filter 120 and a multiplier 122. The low pass filter allows the lower frequency component of the output from the photodiode 54 to pass to the modulation depth controller 92. As described above, it should be clearly understood that the signal from the photodiode 54 is, in effect, an average signal representing the average power received by the photodiode. Even though the light intensity in reflected light 84 is rapidly changing, as represented by signal 70 in FIG. 7, the photodiode 54 is unable to respond with sufficient speed to provide a signal that is accurately representative of the rapidly varying signal 70. Instead, it provides a signal to multiplier 122 and low pass filter 120 which is much more similar to the average power $P_{AVG}$ identified by dashed line 76 in FIG. 7 or the dashed lines in FIGS. 1A and 1B. However, it should also be understood that the average power provided as a first electrical monitoring signal by the photodiode 54 will be varying in response to the time varying portion of the signal caused by the summing of the time varying signal provided by the tone modulation source 98 with the data input 90. Therefore, modulation depth controller 92 receives a signal from the low pass filter 120 which is, in effect, an average of the signal received from the photodiode 54 which, in turn, represents the average power magnitude of the reflected light 84. The output from the photodiode 54 is also multiplied by the time varying signal, or tone signal, provided by the tone modulation source 98. This is performed by multiplier 122 and the resulting signal is transmitted to a low pass filter which, in effect, averages it to provide an output signal to the DC bias level controller 106.

In order to more clearly associate the terminology used to describe the present invention with the components shown in the highly schematic representation of FIG. 8, the first, second, third and fourth electrical monitoring signals are identified in FIG. 8 at the circuit locations where they could be monitored if desired. The first electrical monitoring signal 141 is the output from the photodiode 54. As described above, it represents the average power over time of the reflected light signal 84 because of the frequency response limitations of the photodiode. The output of the low pass filter 120 is the second electrical monitoring signal 142. In effect, it is the average over time of the first electrical monitoring signal 141. The third electrical monitoring signal 143 is created by multiplying the first electrical monitoring signal 141 by the time varying signal from the tone modulation source 98. The fourth electrical monitoring signal 144 is created by averaging the third electrical monitoring signal 143 over time. This is accomplished by passing the signal through the low pass filter 130. The second electrical monitoring signal 142 is used to control the modulation depth of the signal by the modulation depth controller 92. The fourth electrical monitoring signal 144 is used by the DC bias level controller 106 to regulate the bias current $I_{BIAS}$. By controlling the modulation depth and the DC bias level, the problems described above in conjunction with FIGS. 4A and 4B can be reduced or eliminated completely. The bias current can be regulated so that it closely matches the threshold current of the laser. As a result, light is extinguished during the low magnitude portions of the digital electrical input signal and achieves an appropriate magnitude during the high magnitudes portions of the digital electrical input signal.

Figure 9:
FIG. 9 shows a time varying signal, or tone signal, used by the present invention.

FIG. 9 shows a time varying signal 150 such as that which is produced by the tone modulation source 98 in FIG. 8. A typical frequency of the time varying signal 150 is approximately one hundred kilohertz. In comparison, the data signal 70 described above in conjunction with FIG. 7 has a frequency of approximately one gigahertz. The difference in these two frequencies is so great that illustration of the results used by the present invention is difficult. Therefore, it should be understood that the relative magnitudes of the frequencies of signals 70 and 150, as illustrated in FIGS. 7 and 9, are not accurately represented in the Figures. Instead, their relative magnitudes of frequency are intentionally altered to allow the present invention to be more clearly illustrated and represented in the Figures.

With reference to FIGS. 7, 8 and 9, it should be understood that the time varying signal 150, or tone signal, provided by the tone modulation source 98 is added to the low magnitude portions of the data signal 90 by the summing junction 110. It is first added to a DC bias level provided by controller 106. When the data signal is low, high speed gate 96 is switched on to allow the time varying signal to pass from the tone modulation source 98 to the summing junction 104.

Figure 10:
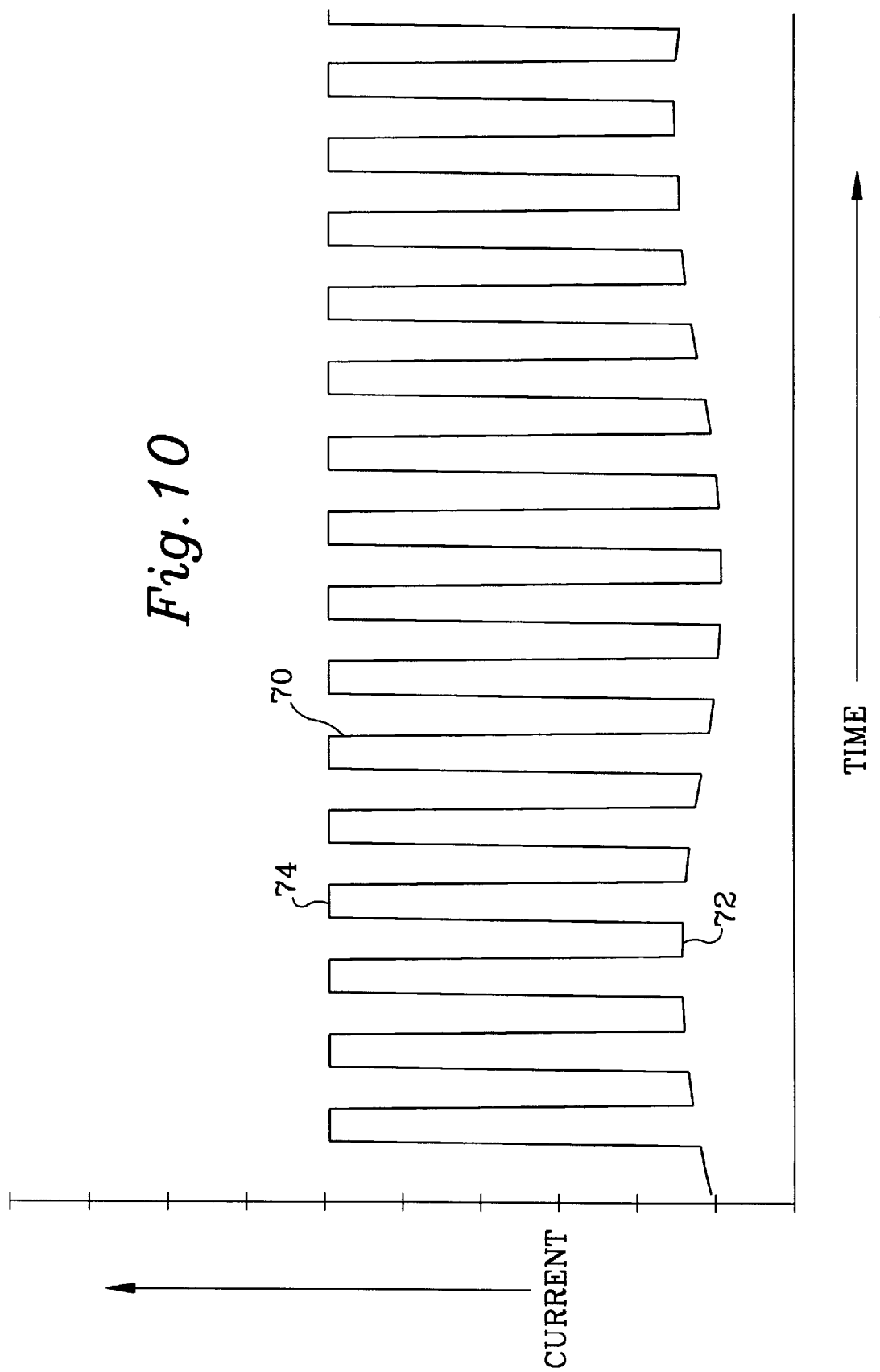
FIG. 10 shows a current signal that results from combining a data signal with the time varying signal of FIG. 9.

FIG. 10 shows the result of the summing junction 110 and the procedure described above. In FIG. 10, the signal 70 has the same magnitude at its high magnitude portion 74, but the low magnitude portions 72 are the result of the addition of the magnitude shown in FIG. 7 and the magnitude of the time varying signal shown in FIG. 9. FIG. 10 represents the current signal provided by the summing junction 110 to the VCSEL 52.

Figure 11:
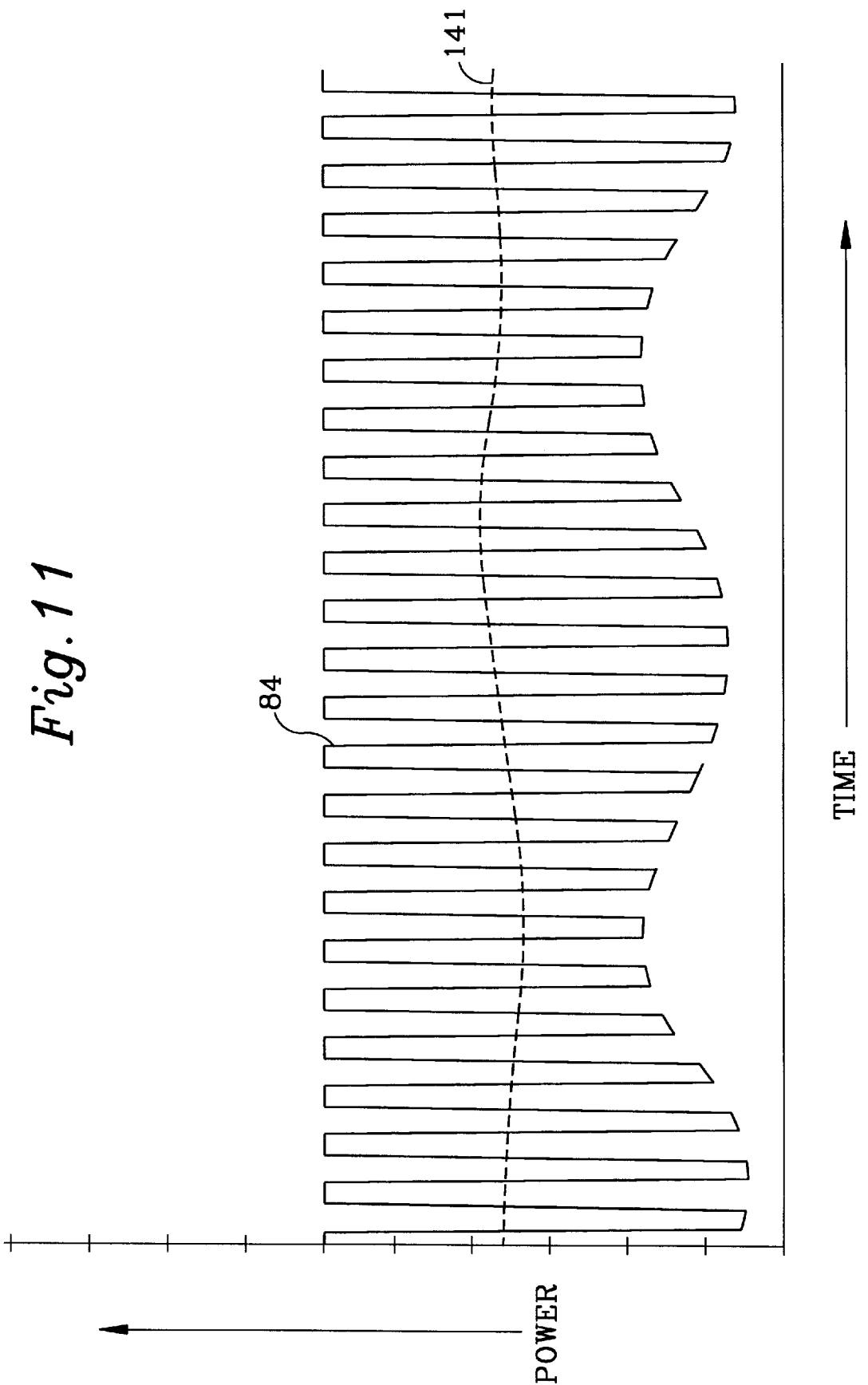
FIG. 11 shows the power of the reflected light signal received by the photodiode and the output signal from the photodiode.

FIG. 11 shows the reflected light signal 84 received by the photodiode 54. The reflected signal 84 is representative of the emitted light signal 80 which, in turn, is responsive to the current signal provided to the VCSEL 52 by the summing junction 110. Also shown in FIG. 11 is the first electrical monitoring signal 141 which is output by the photodiode 54. It should be understood that, in FIG. 11, signal 84 represents the power magnitude variation in the reflected light signal 84. The first electrical monitoring signal 141 is an electrical signal provided by the photodiode 54. These two signals, although existing in different domains, are shown in FIG. 11 to illustrate this relationship between the signals. The first electrical monitoring signal 141 is provided as an output from the photodiode 54 in response to the light signal 84 falling on the photodiode 54.

Figure 12:
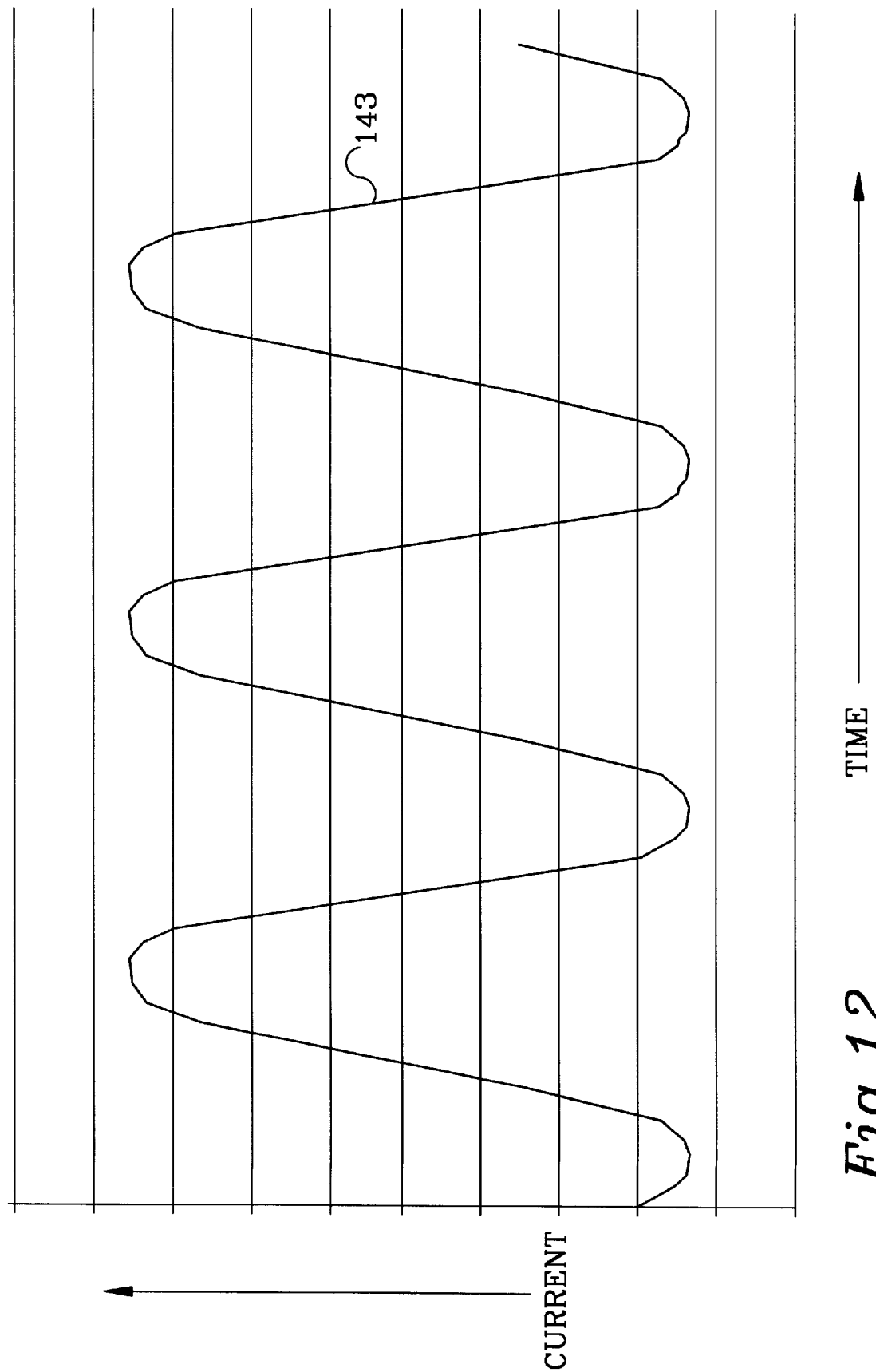
FIG. 12 shows the third electrical monitoring signal.

FIG. 12 shows the third electrical monitoring signal 143 that is provided as an output from multiplier 122 to the low pass filter 130. The fluctuating magnitude of the third electrical monitoring signal 143 results from the multiplication of the first electrical monitoring signal 141 by the time varying signal 150.

Figure 13:
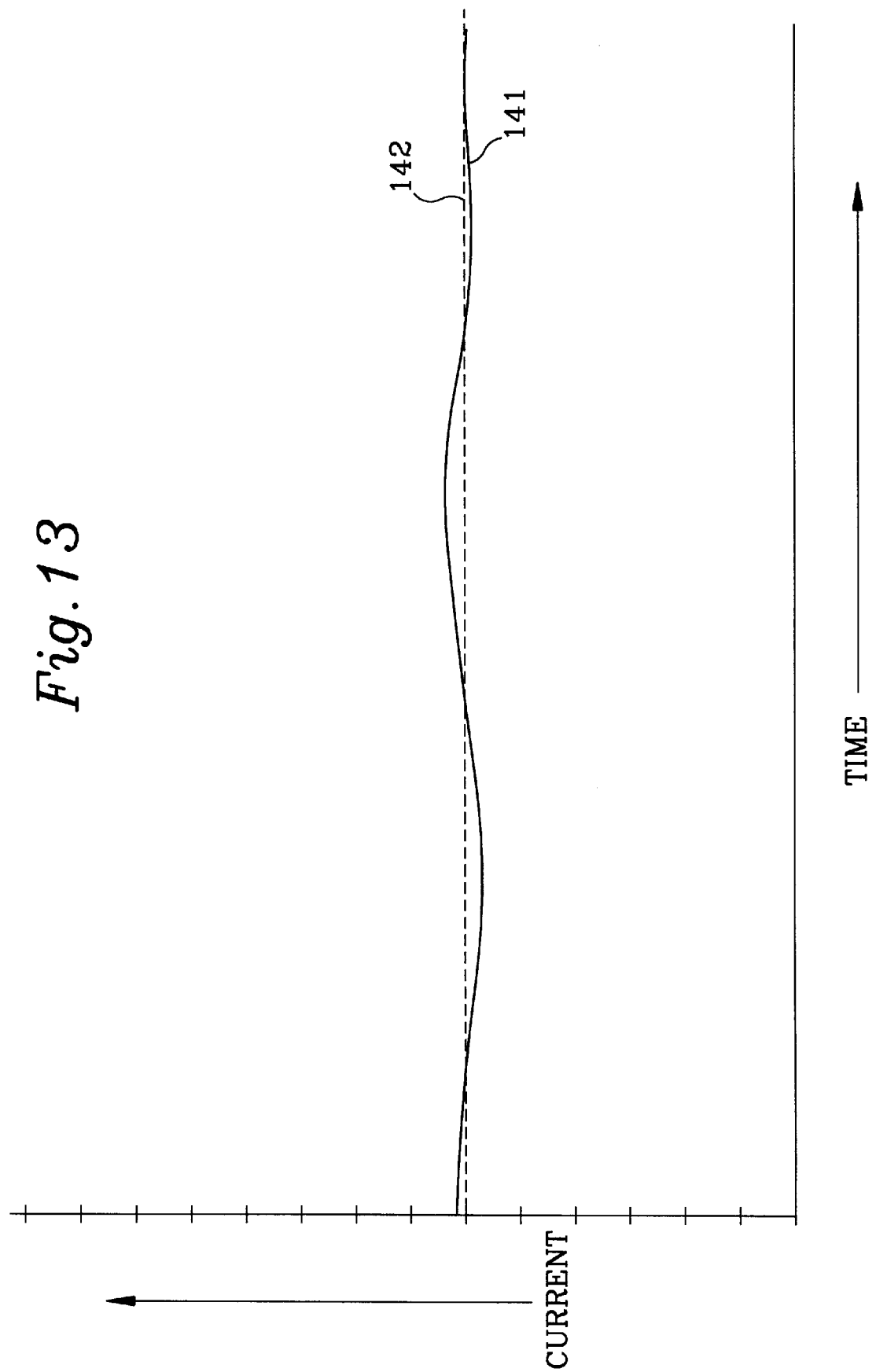
FIG. 13 shows the first and second electrical monitoring signals.

FIG. 13 shows the first electrical monitoring signal 141 and the second electrical monitoring signal 142. As described above, the low pass filter 120 receives the first electrical monitoring signal 141 as an input and provides the second electrical monitoring signal 142 as an output to the modulation depth controller 92.

Figure 14:
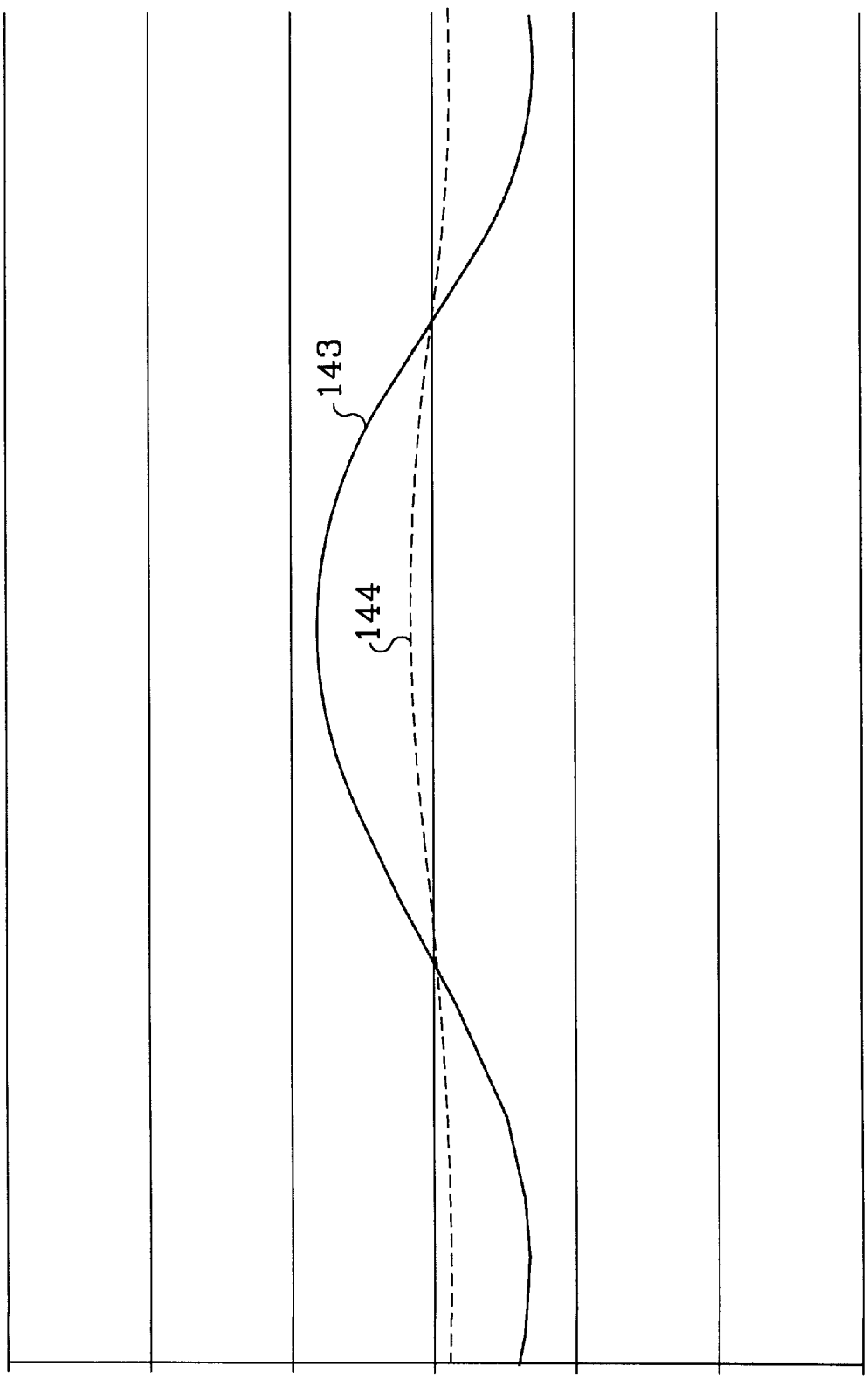
FIG. 14 shows the third and fourth electrical monitoring signals.

FIG. 14 illustrates the third electrical monitoring signal 143 which is provided as an output from the multiplier 122 to the input of low pass filter 130. Furthermore, FIG. 14 shows the fourth electrical monitoring signal 144 which is the output from the low pass filter 130. It is provided as an input to the DC bias level controller 106.

Figure 15:
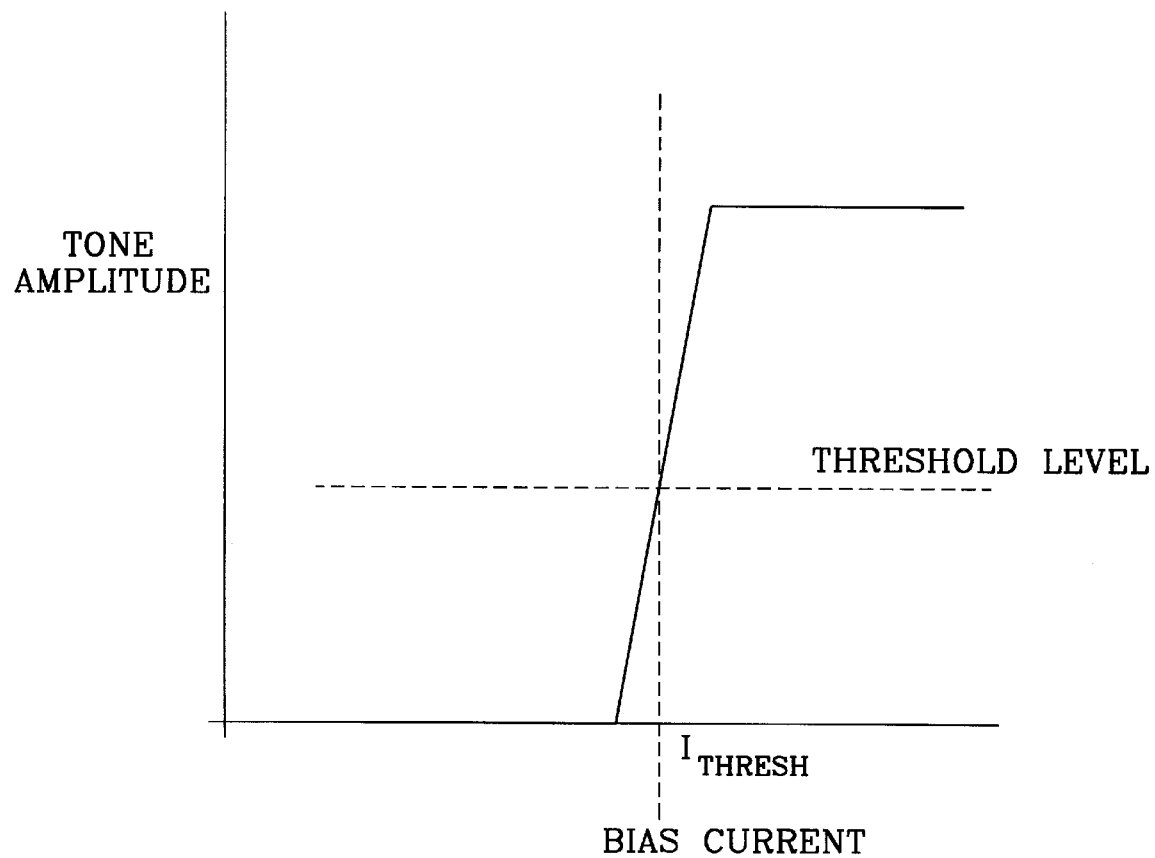
FIG. 15 shows the relationship between the tone amplitude and the bias current.

As described above, the basic principle of the present invention relates to adding a low amplitude, low frequency time varying current modulation 150 to the bias current $I_{BIAS}$ of VCSEL drive. In certain applications of the present invention, the frequency of the time varying signal can be approximately 1 MHz, but the only requirement of this frequency selection is that it be below the low frequency cut off of the data signal and faster than the response time of the mean power control circuit. The data modulation is used to control a high speed switch 96. It is therefore possible to gate the applied tone signal, or time varying signal 150, by passing it through the high speed switch in such a way that it is switched off when the data level is high and allowed to pass through the switch when the data level is low. This ensures that the time varying signal will only be present during the off state of the data pulses. In other words, the time varying signal is only added to the data signal during the low magnitude portions of the data signal. When the optical data stream 84 is reflected onto a low frequency photodiode 54, the data will be averaged because of the frequency response of the photodiode 54, but the time varying signal 150 will pass as a low frequency modulation on the average value. This can be phases synchronously detected by multiplying the recovered tone by the original tone, or time varying signal, to generate a signal whose amplitude is proportional to the fundamental frequency component of the recovered tone. This resulting signal is the third electrical monitoring signal 143 shown in FIG. 12. The only contribution to this signal tone is provided by the off state level of the laser output. If the low magnitude portions of the laser output signal lie above the threshold magnitude, the tone will be present in the recovered signal. However, as the bias level is reduced, the off state will eventually be reduced to a magnitude below threshold and will therefore be hard limited. This eliminates the tone recovered because a negative current passing through a VCSEL does not produce negative light. As the off state gradually passes through the threshold magnitude, the tone will be clipped, or cut off, and the fundamental frequency component will reduce in amplitude through a linear range. This relationship is shown in FIG. 15.

If a very small amplitude of time varying signal 150 is used, the disappearance of the tone signal will more accurately represent the appropriate threshold magnitude. A feedback loop can be constructed by comparing the level of the recovered tone signal to a threshold level and thus generating a feedback signal. The feedback loop will place the off state of the pulse precisely at the threshold or, alternatively, as close to the threshold as is desirable. There are several ways in which the recovered tone can be used to provide a control loop.

Figure 16:
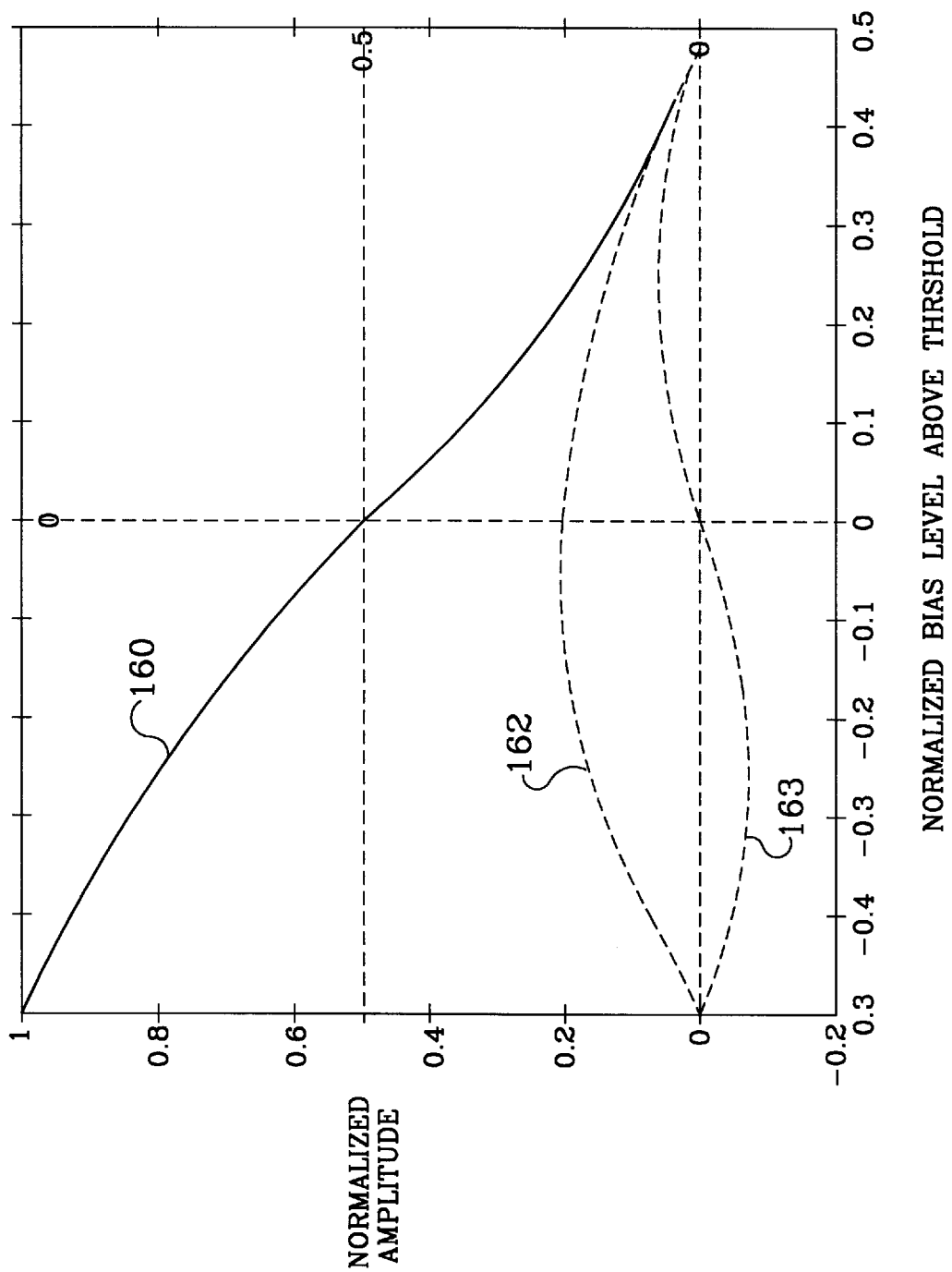
FIG. 16 is a graphical representation of the fundamental frequency, the second harmonic and the third harmonic of the tone signal.

FIG. 16 shows the fundamental frequency 160 of the tone signal, or time varying signal 150, the second harmonic 162 and the third harmonic 163. The second harmonic 162 provides a clear indication of where the threshold occurs because it has a peak at that point. However, this signal is symmetrical about the threshold value and therefore does not generate appropriate information for the control loop in order to determine which way, above or below the threshold, the control loop should drive the signal. A concern with this signal, if used as a control signal, is that if some event causes the controller to move outside the control range, particularly to the high bias side, there is no signal to cause it to return the system to the control range. This could be provided by the fundamental frequency 160 since it, contains information concerning which side of the control point the signal is on. The use of the third harmonic 163 and this fundamental frequency 160 for these purposes is preferable. The control loop could use the output of the third harmonic 163 or first harmonic 160 or any combination of harmonics that permit the control circuit to detect when the threshold has been reached. The error signal generated could then be fed back to the DC bias control in order to maintain the pulse off state at the threshold. The mean power can also be detected and its value compared to a desired level. the error signal thus generated could be applied to the depth of modulation control and, therefore, could maintain the constant depth of modulation. These two control loops could interact and it is therefore essential that their time constants be set in such a way that the mean power control loop has the slowest time constant. This would allow it to maintain power control, but would not be able to follow the tone modulation. The tone modulation would preferably have a time constant approximately ten times faster than the mean power control loop. However, these relative magnitudes of time constant are not limiting to the present invention.

Figure 17:
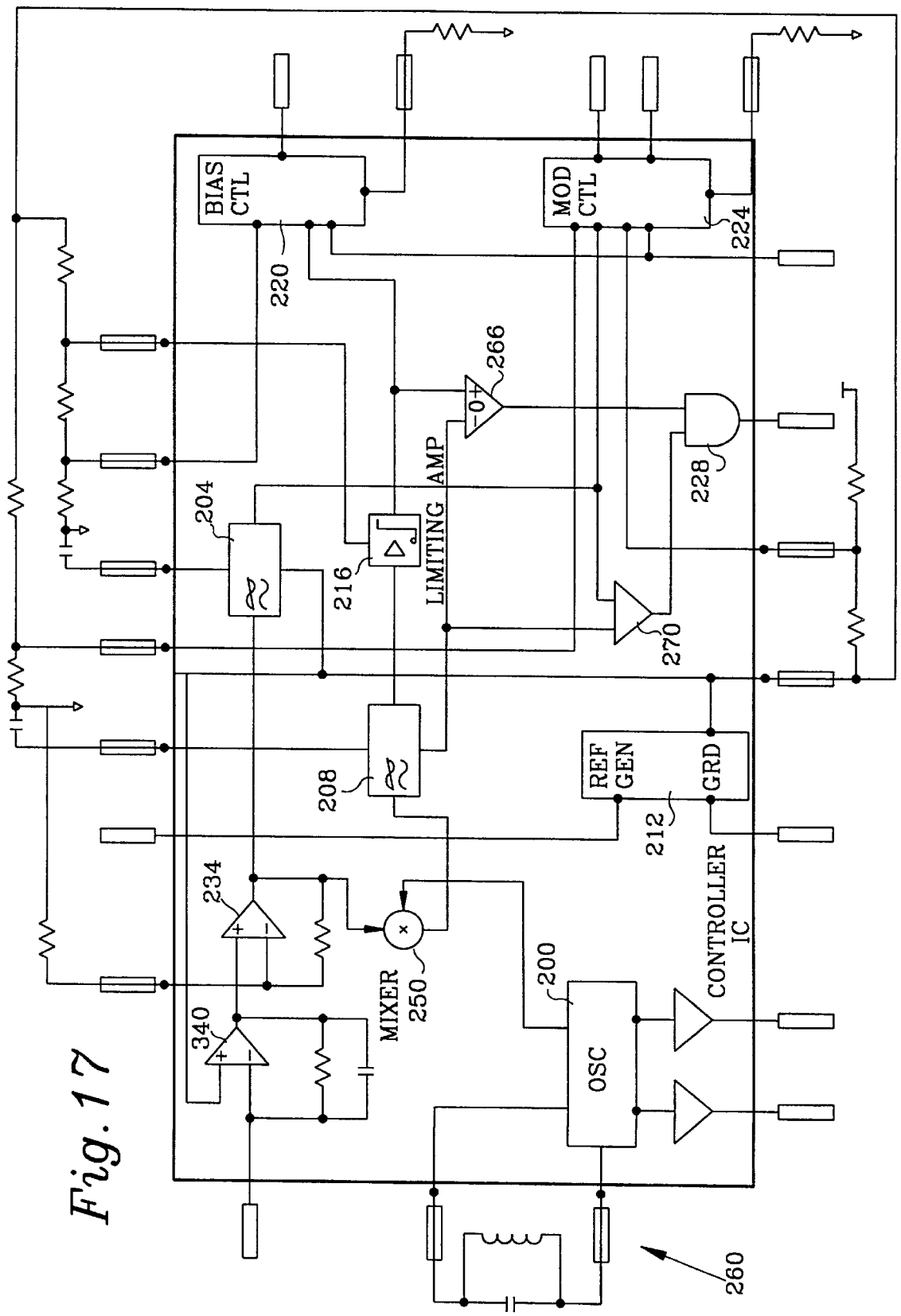
FIG. 17 is a functional schematic illustration of a controlling circuit that can be used to implement the steps of the present invention.

FIG. 17 is a schematic representation of one possible control circuit that could be used in conjunction with the present invention in order to perform certain steps of the method. The first monitoring signal 141 is applied to amplifier 340 and passed to a buffer 234 which allows the signal to be split into two identical parts. One part is fed to mixer 250 which multiplies it with the tone produced in oscillator 200 to produce the third monitoring signal 143. The third monitoring signal 143 is then passed to filter 208 to remove any high frequency components and pass only the DC level portion of the signal which is the fourth monitoring signal 144. This signal is passed to limiting amplifier 216 which compares the signal to a threshold level supplied on pin limit set. If the output of 208 is greater than the threshold level, the signal is driven negative, and vice versa if the output of 208 is less than the threshold providing a signal which contains information determining which side of the threshold limit the signal lies. The signal is then sent to a bias control circuit 220 which is essentially a voltage controlled amplifier whose operation can be understood as a circuit which produces a variable output current in response to a variable input voltage. The output of buffer 234 is also passed to a low pass filter 204 which averages the signal and passes this average level to modulation depth controller 224 in such a way that the output of 224 is a signal whose peak to peak swing amplitude is controlled by the by the output level voltage of the low pass filter 204. The pin Mod set gives the reference level for the modulation controller 224. The modulation controller 224 compares the signal from 204 with this reference level and adjusts the depth of modulation to maintain the signals equal. Components 212, 266, 270, 228 are not essential to the, operation of the controller and simply supply voltage stabilizing circuitry and eye safety shut down features. Components 260 set the oscillation frequency of the tone.

Although the present invention has been described to illustrate a specific embodiment, it should be understood that alternative embodiments are also within its scope. In addition, the particular manner in which the first, second, third and fourth electrical monitoring signals are used by the present invention should not be considered limiting to its method because alternative techniques are known to those skilled in the art.

The embodiments of the invention in which an exclusive property or right is claimed are defined as follows:

1. A method for controlling the operation of a type of laser which provides a digital light output signal in response to receiving a digital electrical input signal which consists of low magnitude portions and high magnitude portions, comprising:

adding a time varying signal to said low magnitude portions of said digital electrical input signal;

causing a representative ratio of said digital light output signal to be received by a light sensitive component;

providing a first electrical monitoring signal from said light sensitive component which is representative of an average value of said digital light output signal over time, said light sensitive component having a frequency response such that said time varying signal portion of said representative ratio of said digital light output signal passes and is represented by said first electrical monitoring signal and the changes of said representative ratio between said high magnitude portions and said low magnitude portions do not pass and are not represented by said first electrical monitoring signal;

averaging said first electrical monitoring signal over time to provide a second electrical monitoring signal;

multiplying said first electrical monitoring signal by said time varying signal to provide a third electrical monitoring signal;

averaging said third electrical monitoring signal over time to provide a fourth electrical monitoring signal; and controlling the magnitude of said low magnitude portions of said digital electrical input signal and the differential magnitude between said low magnitude portions and said high magnitude portions of said digital electrical input signal as a function of said second electrical monitoring signal and said fourth electrical monitoring signal.

2. The method of claim 1, wherein:

said time varying signal is sinusoidal.

3. The method of claim 1, wherein:

said laser is a vertical cavity surface emitting laser.

4. The method of claim 1, wherein:

said adding step limits the addition of said time varying signal to a preselected section of each of said low magnitude portions.

5. The method of claim 4, wherein:

said preselected section is separated by time by a predetermined period from the immediately preceding high magnitude portion of said digital electrical input signal and the immediately succeeding high magnitude portion of said digital electrical input signal.

6. The method of claim 1, wherein:

said adding step further comprises adding a signal to the high magnitude portions of said digital electrical input signal which is 180 degrees out of phase with said time varying signal.

7. The method of claim 1, wherein:

said adding step further comprises adding a signal to the high magnitude portions of said digital electrical input signal which is 90 degrees out of phase with said time varying signal.

8. The method of claim 1 wherein:

said adding step further comprises adding a signal to the high magnitude portions of said digital electrical input signal which is out of phase with said time varying signal by a preselected magnitude of degrees.

9. The method of claim 1, wherein:

said causing step comprises the step of providing a partially reflective lens through which said digital light output signal passes and from which said representative ratio of said digital light output signal is reflected.

10. The method of claim 1, wherein:

said light sensitive component is a photodiode.

11. A method for controlling the operation of a type of laser which provides a digital light output signal in response to receiving a digital electrical input signal which consists of low magnitude portions and high magnitude portions, comprising;

adding a time varying signal to said low magnitude portions of said digital electrical input signal, said time varying signal being sinusoidal;

causing a representative ratio of said digital light output signal to be received by a light sensitive component;

providing a first electrical monitoring signal from said light sensitive component which is representative of an average value of said digital light output signal over time, said light sensitive component having a frequency response such that said time varying signal portion of said representative ratio of said digital light output signal passes and is represented by said first electrical monitoring signal and the changes of said representative ratio between said high magnitude portions and said low magnitude portions do not pass and are not represented by said first electrical monitoring signal;

averaging said first electrical monitoring signal over time to provide a second electrical monitoring signal;

multiplying said first electrical monitoring signal by said time varying signal to provide a third electrical monitoring signal;

averaging said third electrical monitoring signal over time to provide a fourth electrical monitoring signal; and controlling the magnitude of said low magnitude portions of said digital electrical input signal and the differential magnitude between said low magnitude portions and said high magnitude portions of said digital electrical input signal as a function of said second electrical monitoring signal and said fourth electrical monitoring signal.

12. The method of claim 11, wherein:

said laser is a vertical cavity surface emitting laser; and said adding step limits the addition of said time varying signal to a preselected section of each of said low magnitude portions.

13. The method of claim 12, wherein:

said preselected section is separated by time by a predetermined period from the immediately preceding high magnitude portion of said digital electrical input signal and the immediately succeeding high magnitude portion of said digital electrical input signal.

14. The method of claim 11, wherein:

said adding step further comprises adding a signal to the high magnitude portions of said digital electrical input signal which is 180 degrees out of phase with said time varying signal.

15. The method of claim 11, wherein:

said adding step further comprises adding a signal to the high magnitude portions of said digital electrical input signal which is 90 degrees out of phase with said time varying signal.

16. The method of claim 11, wherein:

said adding step further comprises adding a signal to the high magnitude portions of said digital electrical input signal which is out of phase with said time varying signal by a preselected magnitude of degrees.

17. The method of claim 11, wherein:

said causing step comprises the step of providing a partially reflective lens through which said digital light output signal passes and from which said representative ratio of said digital light output signal is reflected.

18. The method of claim 11, wherein:

said light sensitive component is a photodiode.

19. A method for controlling the operation of a type of laser which provides a digital light output signal in response to receiving a digital electrical input signal which consists of low magnitude portions and high magnitude portions, comprising:

adding a time varying signal to said low magnitude portions of said digital electrical input signal, said time signal being sinusoidal;

causing a representative ratio of said digital light output signal to be received by a light sensitive component, said light sensitive component being a photodiode;

providing a first electrical monitoring signal from said light sensitive component which is representative of an average value of said digital light output signal over time, said light sensitive component having a frequency response such that said time varying signal portion of said representative ratio of said digital light output signal passes and is represented by said first electrical monitoring signal and the changes of said representative ratio between said high magnitude portions arm said low magnitude portions do not pass and are not represented by said first electrical monitoring signal, said laser being a vertical cavity surface emitting laser, said adding step limiting the addition of said time varying signal to a preselected section of each of said low magnitude portions, said preselected section being separated by time by a predetermined period from the immediately preceding high magnitude portion of said digital electrical input signal and the immediately succeeding high magnitude portion of said digital electrical input signal;

averaging said first electrical monitoring signal over time to provide a second electrical monitoring signal;

multiplying said first electrical monitoring signal by said time varying signal to provide a third electrical monitoring signal;

averaging said third electrical monitoring signal over time to provide a fourth electrical monitoring signal; and controlling the magnitude of said low magnitude portions of said digital electrical input signal and the differential magnitude between said low magnitude portions and said high magnitude portions of said digital electrical input signal as a function of said second electrical monitoring signal and said fourth electrical monitoring signal.

20. The method of claim 19, wherein:

said adding step further comprises adding a signal to the high magnitude portions of said digital electrical input signal which is out of phase with said time varying signal by a preselected magnitude of degrees.

* * * * *